United States Patent [19]

Arita

[11] Patent Number: 4,964,968
[45] Date of Patent: Oct. 23, 1990

[54] MAGNETRON SPUTTERING APPARATUS

[75] Inventor: Yoji Arita, Yokohama, Japan

[73] Assignee: Mitsubishi Kasei Corp., Japan

[21] Appl. No.: 321,210

[22] Filed: Mar. 9, 1989

[30] Foreign Application Priority Data

| Apr. 30, 1988 [JP] | Japan | 63-105476 |
| Oct. 15, 1988 [JP] | Japan | 63-258365 |
| Dec. 19, 1988 [JP] | Japan | 63-318464 |
| Dec. 19, 1988 [JP] | Japan | 63-318465 |

[51] Int. Cl.$^5$ .............................................. C23C 14/35
[52] U.S. Cl. ............................ 204/298.19; 204/192.12
[58] Field of Search .................... 204/192.12, 298 PM, 204/298.19

[56] References Cited

U.S. PATENT DOCUMENTS

| 4,265,729 | 5/1981 | Morrison, Jr. | 204/298 |
| 4,865,708 | 9/1989 | Welty | 204/192.12 |
| 4,892,633 | 1/1990 | Welty | 204/192.12 |

Primary Examiner—Aaron Weisstuch
Attorney, Agent, or Firm—Stephen F. K. Yee

[57] ABSTRACT

A magnetron sputtering apparatus has a target disposed above an inner magnetic pole surrounded by an outer magnetic pole of opposite polarity and a gradient adjusting means mounted underneath the target and interposed between the inner and outer magnetic poles. The gradient adjusting means operates such that the gradient of the component of the leakage magnetic field vertical to the target is reduced over the middle portion of the target, between the inner and outer magnetic poles, and is increased at portions closer to the magnetic poles. The gradient adjusting means may be made of a soft magnetic material or a permanent magnet material, and the soft magnetic material may be used alone or in combination with the permanent magnet material. A second permanent magnet may be used in conjunction with the use of a permanent magnet as the gradient adjusting means. The magnetron sputtering apparatus prevents localized erosion of the target, thus making the area of erosion on the target more uniform, prolonging the life of the target, and providing for more even sputtered films.

16 Claims, 9 Drawing Sheets

MAGNETRON SPUTTERING APPARATUS

BACKGROUND OF THE INVENTION

1. Field of the Invention

The present invention relates to a magnetron sputtering apparatus and, more particularly, to a magnetron sputtering apparatus adapted to prevent local erosion of the target, thereby prolonging the life of the target.

2. Related Art

A conventional magnetron sputtering apparatus, shown in FIG. 13 in a square form, comprises a target 1 made of a ferromagnetic material, an inner magnetic pole 2 mounted on the reverse side of the target 1, and an outer magnetic pole of opposite polarity and surrounding the inner magnetic pole 2. These members are positioned in a vacuum chamber. The target 1 is usually mounted on a backing plate made of a non-magnetic material such as copper. A coil 4 is also provided to apply an electric current to energize the magnetic poles 2, 3. Although the inner and outer magnetic poles 2 and 3 are usually made of an electromagnet, they may be of a permanent magnet.

In using the magnetron sputtering apparatus, an energizing current is applied to the coil 4 that provides the target 1 with a magnetic field in the direction as shown by the arrows in the drawing, and $A_r$ sputtering ions, for example, bombard the target 1, thus applying sputtered particles on an article (not shown) to be coated.

FIG. 14 shows another conventional magnetron sputtering apparatus in a round shape and its principal structural members are the same as that shown in FIG. 13.

The conventional magnetron sputtering apparatuses as shown in FIGS. 13 and 14 are designed to trap electrons that are components of the plasma in parallel to the target 1 among a leakage magnetic field from the inner and outer magnetic poles 2 and 3 and that scatter from the target 1, thus facilitating ionization of gaseous molecules and permitting sputtering at a high speed.

In these conventional magnetron sputtering apparatuses, the trapped electrons near the surface of the target 1 are enclosed within a tunnel-shaped magnetic field, as shown by the arrows in FIGS. 13 and 14, and they are allowed to move along the tunnel. Accordingly, it is to be understood that the degree of sputtering of the surface of the target 1 depends upon the distribution of the vertical and horizontal components of the magnetic field with respect to the upper surface of the target 1. FIGS. 15($a$) and 15($b$) show distributions of the horinzontal and vertical components, respectively, of the magnetic field above the upper surface of the target 1 as a function of distance from the center of the target 1 to an edge thereof (as shown by line A—B in FIG. 13), the target 1 being made of a ferromagnetic material such as iron or cobalt.

FIG. 16 shows the pattern of erosion of the target 1 shown in the cross section taken between the points A and B in FIG. 13. Erosion is shown to develop locally, thereby shortening the life of the target 1 to a considerable extent.

In order to overcome the problem of localized erosion, a number of longitudinal grooves have been provided on the surface of the target 1 to allow a horizontal magnetic field to be created over the surface of the target (GT Target: Nippon Kinzoku Gakkaiho, Vol. 25, No. 6, P562 (1986)). This solution suffers from the disadvantage, however, that it is not easy to prepare the target 1.

It has been found that the location where erosion develops corresponds to the position where the polarity of the vertical components of the magnetic field changes, namely, at a point where the vertical components thereof become zero, without any direct relationship to the intensity of the horizontal components of the magnetic field.

This finding is based on the assumption that the concentration of the trapped electrons becomes higher near the point where the vertical components become zero, while as shown in FIGS. 13 and 14, the electrons move periodically in a direction in which a gradient of the vertical components of the magnetic field is present, as well as along the magnetic field tunnel on the surface of the target 1. Once erosion occurs on the target 1, the leakage magnetic field, as shown in FIG. 15, becomes larger and the gradient of the vertical magnetic field at the position of erosion gets larger, thus further increasing local erosion.

A conventional large-scale magnetron sputtering apparatus primarily uses an electromagnet for its inner and outer magnetic poles; however, the electromagnet has a higher operating cost. Accordingly, the use of a permanent magnet is desired, but the flux density of the outer magnetic pole must be made larger because the flux density of the outer magnetic pole is reduced around the exterior circumference of the outer magnetic pole compared with the inside thereof.

SUMMARY OF THE INVENTION

In order to overcome the disadvantages inherent in the conventional magnetron sputtering apparatuses, the present invention has as its object to provide a magnetron sputtering apparatus adapted to prevent occurrence of localized erosion, thus prolonging target life.

In order to achieve the object, in one aspect the present invention provides a magnetron sputtering apparatus in which a gradient adjusting means for adjusting the gradient of the component of the leakage magnetic field emanating from the inner magnetic pole and the outer magnetic pole is disposed in the magnetic field formed between the inner magnetic pole and the exterior magnetic pole, both of which are mounted on the reverse side of the target. The gradient of the component vertical to the target is adjusted in such a manner that the gradient is reduced at a middle portion between the inner magnetic pole and the outer magnetic pole and increased at a position near the inner magnetic pole and the outer magnetic pole.

The gradient adjusting means may be made of a soft magnetic material which has a cross-sectional area tapered from its central portion to its sides, which is curved so as to become gradually greater or further apart at both end portions, or which is divided into plural sections in a lengthwise direction. The gradient adjusting means may also be made of a permanent magnet which has magnetization in a horizontal direction in such a manner that the intensity of magnetization is weaker at a middle portion and becomes gradually stronger closer to both sides, or the intensity of magnetization is lower at its middle portion and becomes gradually higher closer to both ends.

In another aspect, the present invention comprises a magnetron sputtering apparatus in which a permanent magnet having magnetization in a horizontal direction is mounted between the inner magnetic pole and the outer magnetic pole, and another permanent magnet having magnetization opposite to the former is further disposed in abutment with an outer side surface of the outer magnetic pole. The gradient adjusting means in this case may likewise be made of soft magnetic material or of permanent magnet material having characteristics as described hereinabove.

In accordance with the present invention, there is disposed a gradient adjusting means for adjusting the gradient of the component, vertical with respect to the target, of the leakage magnetic field between the inner and outer magnetic poles in such a manner as to reduce the gradient at a middle portion therebetween and to enlarge it at a position near the magnetic poles over the target so that localized erosion can be prevented.

In instances where a soft magnetic material is used for the gradient adjusting means, the gradient of the vertical component of the leakage magnetic field can be adjusted with a simple construction of the apparatus. If the shape of the soft magnetic material is modified, an optimal gradient of the vertical component of the leakage magnetic field may be set in accordance with the magnetic characteristic or thickness of the target. The permanent magnet used for the gradient adjusting means can act in the same manner as the soft magnetic material without addition of a soft magnetic material.

In a further aspect, the present invention provides a magnetron sputtering apparatus in which a soft magnetic material is disposed between the inner and outer magnetic poles for cancelling flux density in order to prevent localized erosion on the target, the magnetron sputtering apparatus being provided with a permanent magnet in abutment with an outer side surface of the outer magnetic pole to compensate for a decrease in the flux density of the outer magnetic pole, thus raising the flux density of the outer magnetic pole to a sufficiently high level. As a result, large-scale magnetron sputtering with a wider erosion area is provided.

DETAILED DESCRIPTION OF THE PREFERRED EMBODIMENTS

Figure 1:
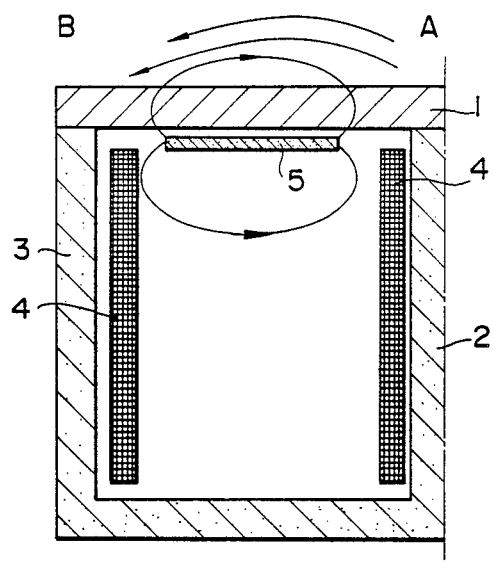
FIG. 1 is a cross-sectional view showing an essential portion of one example of the magnetron sputtering apparatus according to the present invention.

As shown in FIG. 1, a target 1 is mounted on an inner magnetic pole 2 and an outer magnetic pole 3. A gradient adjusting means is mounted under the lower surface of the target 1, between the inner and outer magnetic poles 2 and 3. A coil 4 is disposed on each of the inner sides of the inner and outer magnetic poles 2 and 3.

The gradient adjusting means may include a soft magnetic material 5 which is magnetized in a direction parallel to the magnetic field generated by the inner magnetic pole 2 and the outer magnetic pole 3 and which acts in such a manner as to reduce the absolute value of the horizontal magnetic field and the gradient of the vertical magnetic field, vertical to the target 1, over the upper surface of the target 1. Specifically, the gradient adjusting means performs a shielding action. The soft magnetic material 5 may be easily mounted on a conventional magnetron sputtering apparatus and this is extremely advantageous in terms of practical application. The soft magnetic material 5 serves as a means for attenuating the magnetic field over the upper surface of the target 1, thus preventing the leakage magnetic field above the target 1 from becoming larger and erosion from getting larger locally, by increasing the intensity of magnetization of the soft magnetic material 5 when erosion of the target 1 develops as the leakage magnetic field over the target 1 and also around the soft magnetic material 5 becomes larger.

Figure 2A:
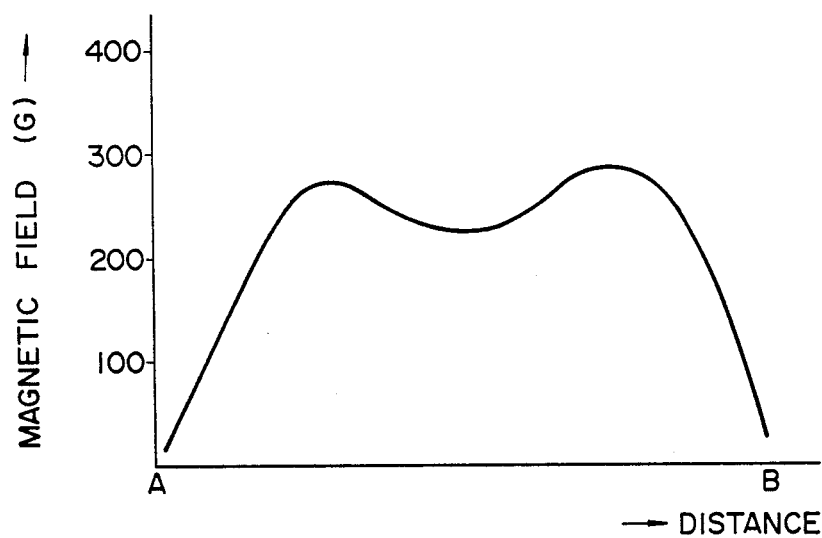
FIG. 2(a) is a graph showing the horizontal component of a magnetic field between points A and B shown in FIG. 1.
Figure 2B:
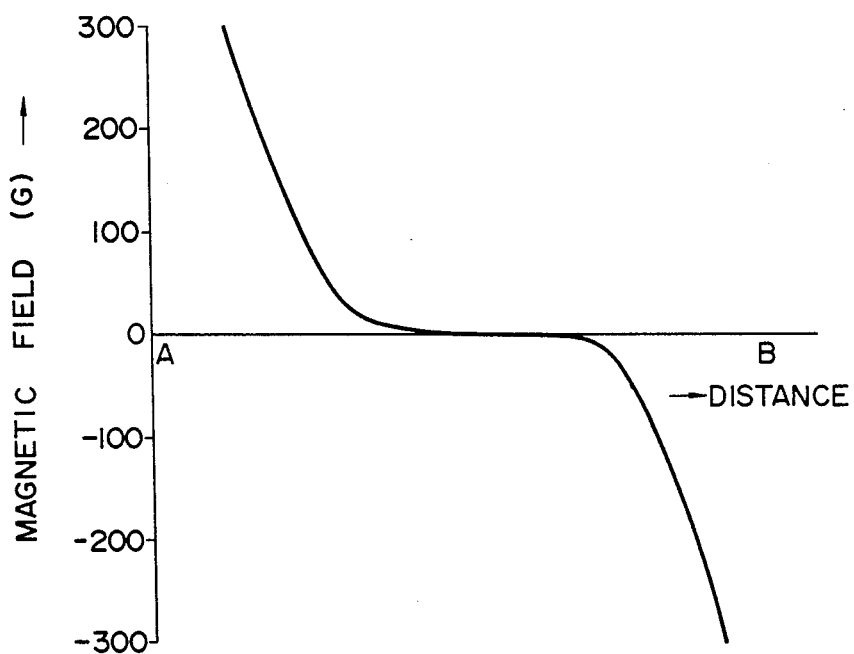
FIG. 2(b) is a graph showing the vertical component of a magnetic field between points A and B shown in FIG. 1.

Referring to FIGS. 2(a) and 2(b), the distributions of the horizontal and vertical components of the magnetic field, respectively, between the points A and B in FIG. 1 are shown.

Figure 3:
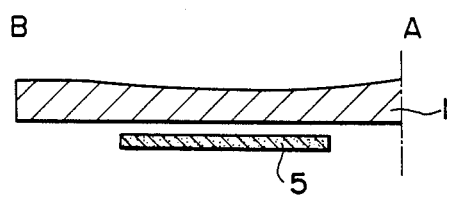
FIG. 3 is a view showing the pattern of erosion on the target between points A and B in FIG. 1.
Figure 16:
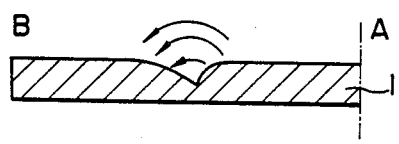
FIGS. 16 is a view illustrating the pattern of erosion of the target between points A and B in FIG. 13.
Figure 15A:
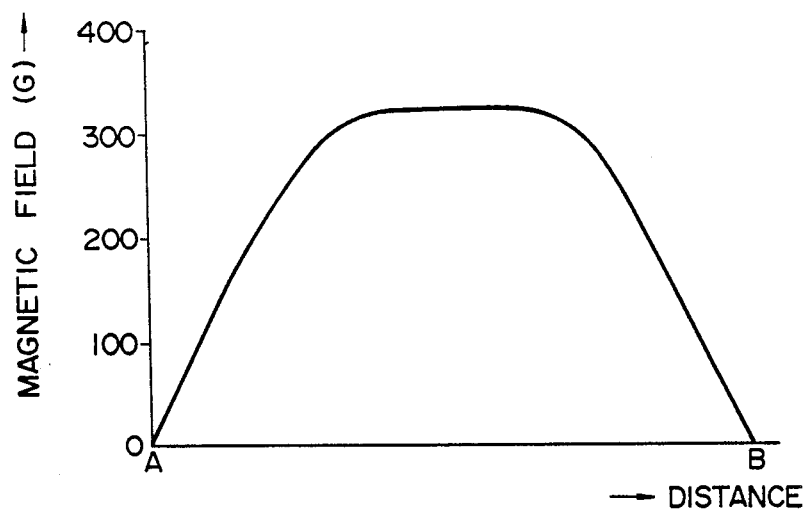
FIGS. 15(a) and 15(b) are graphs showing the horizontal and vertical components of the magnetic field between points A and B in FIG. 13.
Figure 15B:
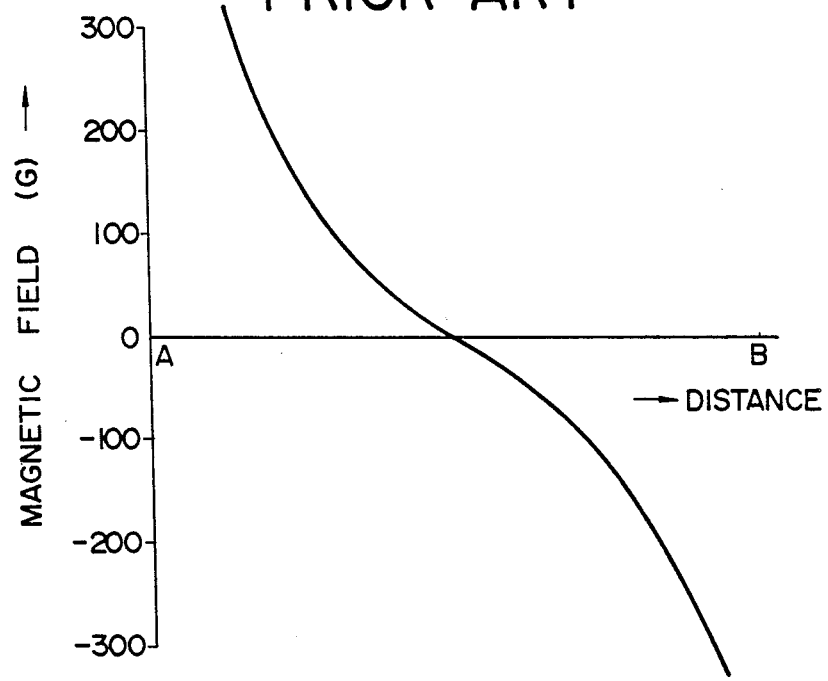

Referring now to FIG. 3, it is seen that the magnetron sputtering apparatus according to the present invention incurs erosion between the points A and B in FIG. 1 in a comparatively uniform manner over a wide area on the target 1, unlike the conventional magnetron sputtering apparatuses which has a V-shaped erosion of the target as shown in FIG. 16. The use of the soft magnetic material 5 allows erosion to be spread over a wider area of the target 1 so that the sputtered films become more uniform in thickness.

The soft magnetic material 5 may preferably be disposed to correspond from 20% to 90%, preferably from 60% to 80%, of the area between the inner magnetic pole 2 and the outer magnetic pole 3. The soft magnetic material 5 to be used for the present invention may be in the form of a plate or bar.

Although the arrangement as described hereinabove is particularly effective for the magnetron sputtering apparatus where the target 1 is made of a ferromagnetic material, it may be applicable also to a target 1 made of a non-magnetic material, thus likewise enlarging the area in which erosion occurs in a substantially uniform manner.

It is to be understood that the soft magnetic material 5 may be in various forms. Furthermore, a permanent magnet may be used as an alternative gradient adjusting means in combination with or in place of the soft magnetic material 5.

Figure 4:
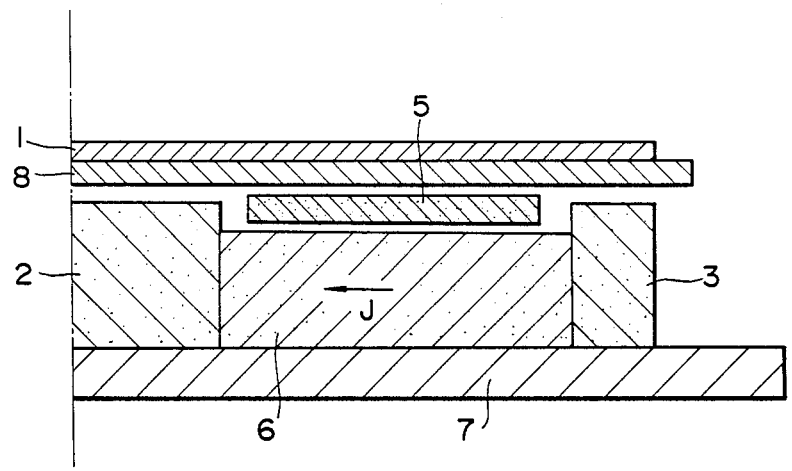
FIGS. 4 to 12 are cross-sectional views showing an essential portion of other examples of the magnetron sputtering apparatuses according to the present invention.

FIG. 4 shows an example in which soft magnetic material 5 in rectangular form in cross section is used as the gradient adjusting means disposed underneath a backing plate 8 interposed between the target 1 and the inner and outer magnetic poles 2 and 3. The target 1 is disposed in this case so as to cover an upper surface portion of the outer magnetic pole 3. A permanent magnet 6 is mounted underneath the soft magnetic material 5, on a base plate 7, and interposed between the inner and outer magnetic poles 2 and 3. This structure can reduce the gradient and absolute value of the vertical magnetic field, thus permitting dispersion of electron concentrations.

Figure 5:
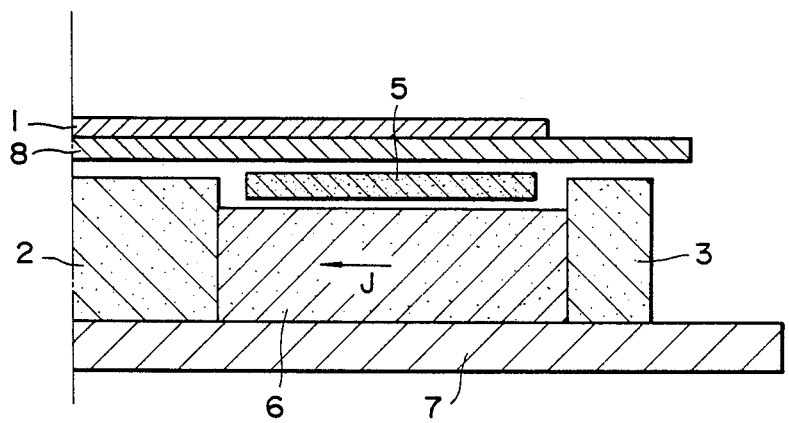

FIG. 5 shows another example having substantially the same structure as in FIG. 4, except that the target 1 does not extend over the upper surface portion of the outer magnetic pole 3. However, it is to be noted that this structure can provide substantially the same effects as the example shown in FIG. 4.

Figure 6:
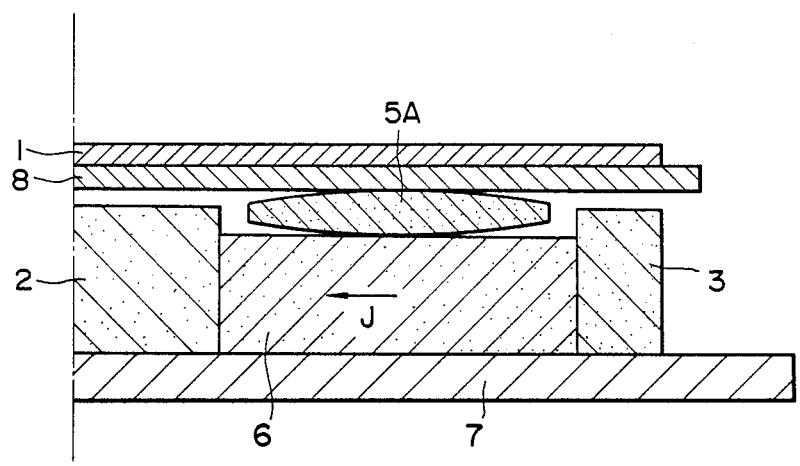

FIG. 6 shows a further example having substantially the same structure as in FIG. 4, except for the form of the soft magnetic material 5A. In this case, the soft magnetic material 5A is of such cross-sectional shape that the middle portion thereof is larger and both side end portions thereof become gradually smaller. In this case, the smaller shape of the both side end portions can reduce the influence of the magnetic field on target areas near the inner and outer magnetic poles 2 and 3, thus permitting more uniform erosion of the target 1 than the example shown in FIG. 4.

Figure 7:
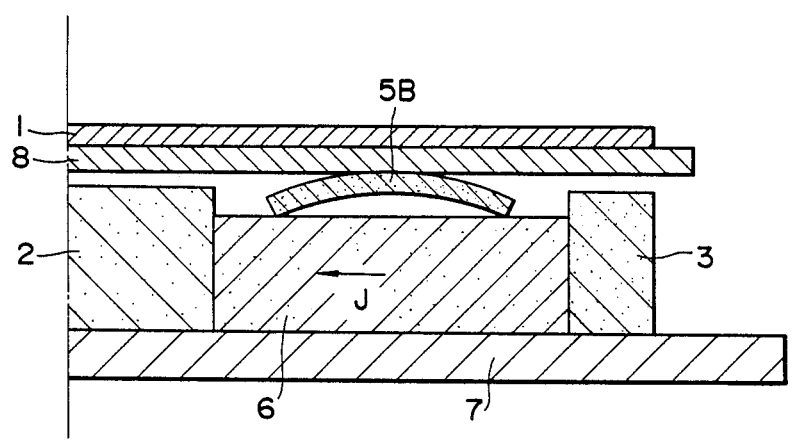

FIG. 7 is a further example having substantially the same structure as in FIG. 4, except for the form of the soft magnetic material 5B. In this case, the soft magnetic material 5B is curved in an arcuate manner and is mounted such that the convex side faces the backing plate 8 and the concave side thereof faces the permanent magnet 6. This arrangement can produce substantially the same effects as shown in FIG. 6 and is less expensive because the soft magnetic material 5B can be readily prepared merely by curving the material.

Figure 8:
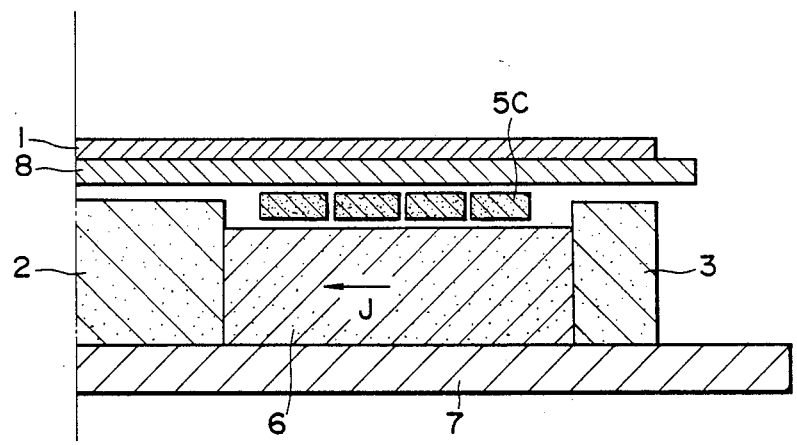

FIG. 8 shows a further example having substantially the same structure as in FIG. 4, except that the soft magnetic material 5C is divided into plural sections in a lengthwise direction and the gap between adjacent soft magnetic materials is kept very small. In this example, the soft magnetic material 5C is so divided that the distribution of the magnetic field on the ferromagnetic target 1 can be readily adjusted, thereby providing more uniform erosion than that shown in FIG. 4.

Figure 9:
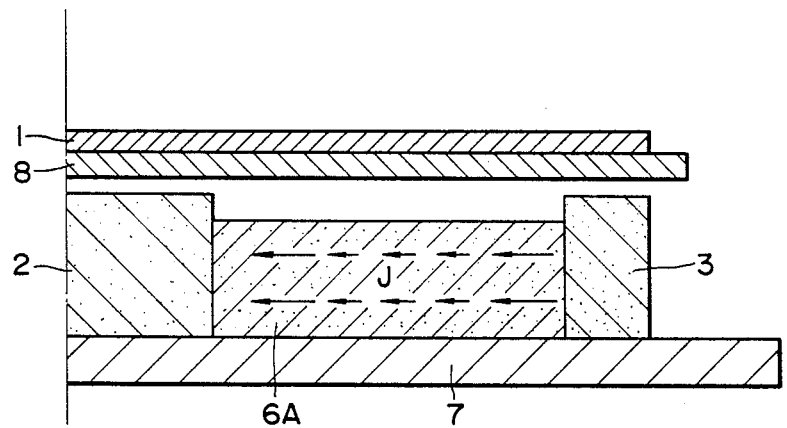

FIG. 9 shows an example in which a permanent magnet 6A is mounted on the base plate 7 and interposed between the inner and outer magnetic poles 2 and 3 underneath the backing plate 8. The permanent magnet 6 is designed in such a manner that the intensity of magnetization J is relatively weaker at its middle portion and becomes stronger closer to both side end portions. This arrangement permits a reduction in the gradient of the vertical magnetic field of the target 1 and provides a wider area on the target 1, in which the vertical magnetic field is close to zero. This structure does not require any soft magnetic material 5. This apparatus thus can prevent local erosion of the target 1 by means of the permanent magnet 6A.

Figure 10:
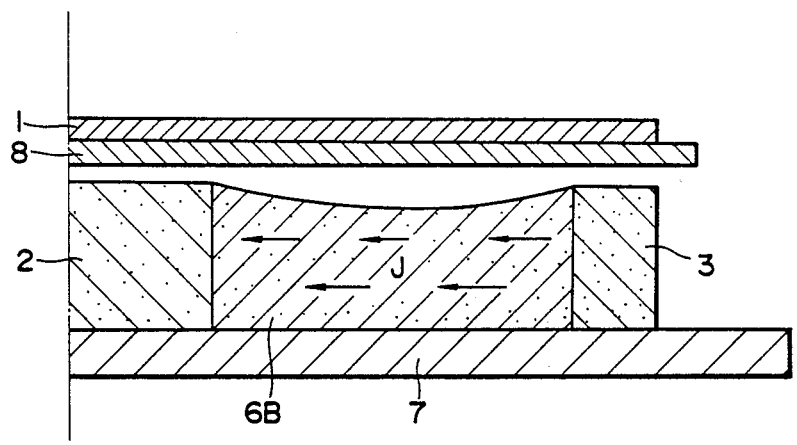

FIG. 10 is another example showing the magnetron sputtering apparatus according to the present invention in which there is used a permanent magnet 6B in a shape different from that used in FIG. 9, which is interposed between the inner and outer magnetic poles 2 and 3. The permanent magnet 6B is of such a shape that the middle portion of its upper side is curved in a concave manner and its both side end portions are raised. This example shows the same effects as that in FIG. 9.

Figure 11:
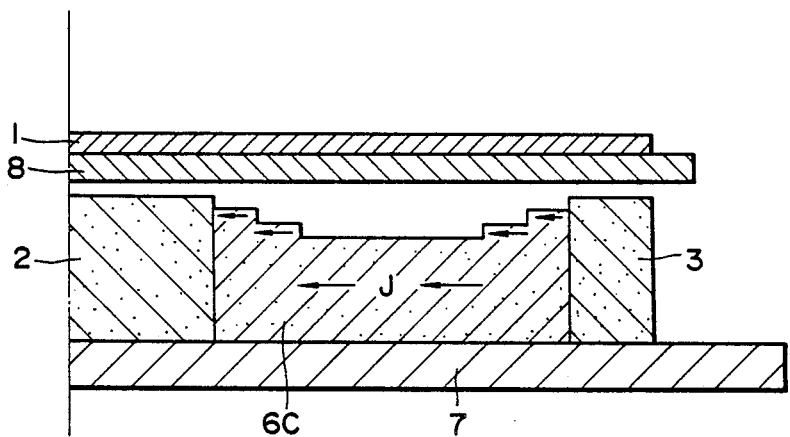

FIG. 11 is a further example in which a permanent magnet 6C is indented from both its side end portions in a stepwise manner. This example has the same effects as the examples of FIGS. 9 and 10.

Figure 12:
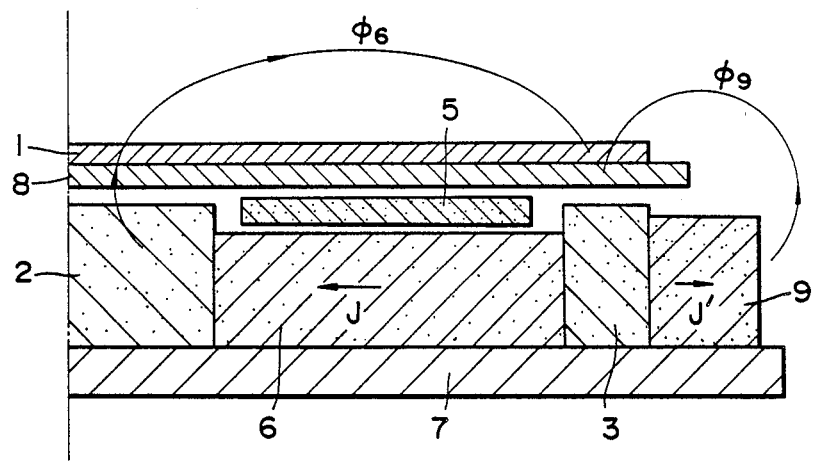
Figure 13:
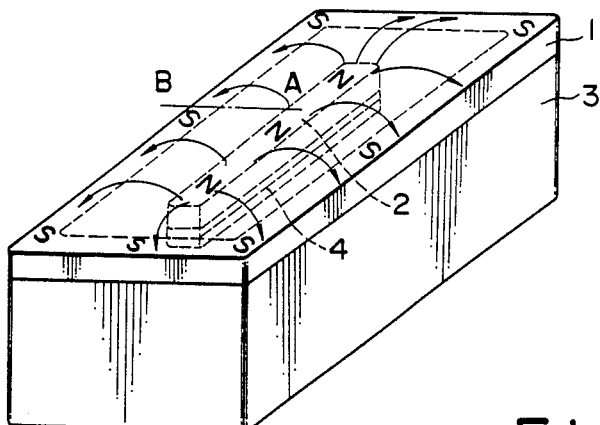
FIGS. 13 and 14 are perspective views showing examples of conventional magnetron sputtering apparatuses.
Figure 14:
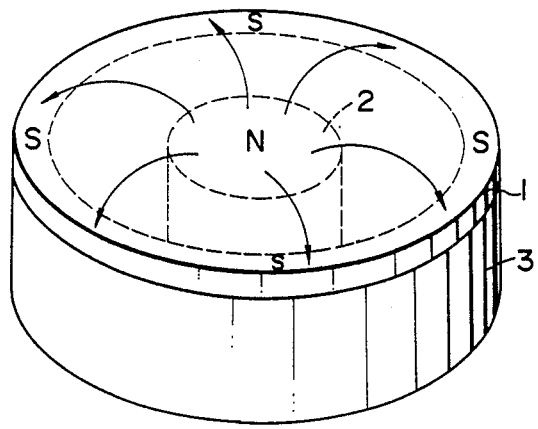

Furthermore, FIG. 12 is another example in which a means for enlarging the flux density of the outer magnetic pole 3 is applied to the magnetron sputtering apparatus having the structure as in FIG. 4. In this example, a soft magnetic material is used for each of the inner and outer magnetic poles 2 and 3, and a permanent magnet 6 having magnetization J in a horizontal direction is interposed between the magnetic poles 2 and 3. Another permanent magnet 9 is disposed in abutment with the outer side surface of the outer magnetic pole 3, which possesses magnetization J' opposite to that of the permanent magnet 6. As shown in FIG. 12, a flux $O_6$ between the inner and outer magnetic poles 2 and 3 is arranged such that a flux density is larger on the side of the inner magnetic pole 2 and smaller on the side of the outer magnetic pole 3. This tendency becomes remarkable as the magnetron gets larger. It is noted, however, that a flux $\Phi_9$ generated by the permanent magnet 9 disposed on the outer side surface of the outer magnetic pole 3 increases the flux density near the target 1 because the permanent magnet 9 possesses magnetization J' opposite to the magnetization J inherent in the permanent magnet 6. This improves the effect of enclosing the electrons.

Although the example shown in FIG. 12 uses soft magnetic material 5 that is rectangular in shape, it is to be noted that the soft magnetic material 5 of shapes as shown in FIGS. 6, 7 and 8 may be used in place of the soft magnetic material 5 used in FIG. 12. There may be used as the permanent magnet 6 one in which the magnetization is weaker in its middle portion and stronger at its both side end portions, as shown in FIG. 9, as well as one in which the middle portion of the upper surface of the permanent magnet 6 is curved concavely, as shown in FIG. 10, or where the middle portion thereon is lowered stepwise, as shown in FIG. 11.

As has been described hereinabove, the magnetron sputtering apparatus according to the present invention is provided on a reverse surface of the target with a gradient adjusting means for adjusting the gradient of the leakage magnetic field so that the gradient of the component of the magnetic field vertical to the target is reduced over the middle portion of the target, between the magnetic poles, and increased at portions closer to the magnetic poles. This arrangement can reduce the gradient of the magnetic field vertical to the target and provide a wider area over the target in which the absolute value of the vertical magnetic field is small so that the concentrations of electrons can be dispersed, thus making erosion of the target more uniform and prolonging the life of the target.

The use of the soft magnetic material as the gradient adjusting means can simplify the structure and permit adjustment of the gradient of the vertical component of the leakage magnetic field in accordance with magnetic characteristics and thickness of the target. Furthermore, variations in the shape of the soft magnetic material can provide favorable effects on compensation of distribution of the magnetic field attendant upon development of an erosion pattern on a ferromagnetic target. The use of the permanent magnet as the gradient adjusting means can minimize the size because no soft magnetic material is required.

It is further to be noted that if a permanent magnet is mounted in abutment with an outer side surface of the outer magnetic pole, the flux density of the outer magnetic pole can be elevated to a sufficiently high level so that a magnetron mode for a large-scale magnetron apparatus can be held in a stable state at the time of sputtering and that the erosion area widened to cover substantially the entire area of the target, thereby increasing the life of the target and achieving sputtering of a high-quality film with a uniform film thickness.

What is claimed is:

1. A magnetron sputtering apparatus comprising:
   an inner magnetic pole;
   an outer magnetic pole arranged to surround the inner magnetic pole and having a polarity opposite to that of the inner pole;
   a target disposed at least above the inner magnetic pole and extending therefrom towards the outer magnetic pole; and
   a gradient adjusting means, mounted underneath the target in the magnetic field formed between the inner and outer magnetic poles, for adjusting the gradient of the component of the leakage magnetic field vertical to the target, in such a manner that the gradient above the target is reduced at a middle portion of the upper surface of the target between the inner and outer magnetic poles, and the gradient is increased near the side end portions of the upper surface of the target near the inner and outer magnetic poles.

2. A magnetron sputtering apparatus as claimed in claim 1, wherein the gradient adjusting means is a soft magnetic material or a permanent magnet.

3. A magnetron sputtering apparatus as claimed in claim 2, wherein the soft magnetic material is shaped such that its middle portion, in cross section, is relatively larger and both its side end portions become gradually smaller.

4. A magnetron sputtering apparatus as claimed in claim 2, wherein the soft magnetic material is in a curved form, and is disposed in such a manner that both its side end portions become gradually greater in distance from the lower surface of the target than its middle portion.

5. A magnetron sputtering apparatus as claimed in claim 2, wherein the soft magnetic material is divided lengthwise into a plurality of discrete sections.

6. A magnetron sputtering apparatus as claimed in claim 2, wherein the permanent magnet is magnetized in a substantially horizontal direction and the intensity of the magnetization is relatively weaker at its middle portion and gradually becomes stronger towards both its side end portions.

7. A magnetron sputtering apparatus as claimed in claim 2, wherein the permanent magnet is magnetized in a substantially horizontal direction and the height of the magnet is lower at its middle portion and gradually becomes higher towards both its side end portions.

8. A magnetron sputtering apparatus comprising:
   an inner magnetic pole of a soft magnetic material;
   an outer magnetic pole of a soft magnetic material arranged to surround the inner magnetic pole and having a polarity opposite to that of the inner pole;
   a target disposed at least above the inner magnetic pole and extending therefrom towards the outer magnetic pole;
   a gradient adjusting means, mounted underneath the target in the magnetic field formed between the inner and outer magnetic poles, for adjusting the gradient of the component of the leakage magnetic field vertical to the target, in such a manner that the gradient above the target is reduced at a middle portion of the upper surface of the target between the inner and outer magnetic poles, and the gradient is increased near the side end portions of the upper surface of the target near the inner and outer magnetic poles; and
   a permanent magnet magnetized in a substantially horizontal direction, disposed underneath the gradient adjusting means between the inner and the outer magnetic poles.

9. A magnetron sputtering apparatus as claimed in claim 8, further comprising a second permanent magnet having magnetization opposite to the permanent disposed between the inner and outer magnetic poles, which is disposed in abutment with an outer surface of the outer magnetic pole.

10. A magnetron sputtering apparatus as claimed in claim 8 or 9, wherein the gradient adjusting means comprises a soft magnetic material shaped such that its middle portion, in cross section, is relatively larger and both its side end portions become gradually smaller.

11. A magnetron sputtering apparatus as claimed in claim 8 or 9, wherein the gradient adjusting means comprises a soft magnetic material in a curved form, and is disposed in such a manner that both its side end portions become gradually greater in distance from the lower surface of the target than its middle portion.

12. A magnetron sputtering apparatus as claimed in claim 8 or 9, wherein the gradient adjusting means comprises a soft magnetic material divided lengthwise into a plurality of discrete sections.

13. A magnetron sputtering apparatus as claimed in claim 8 or 9, wherein the gradient adjusting means comprises a permanent magnet magnetized in a substantially horizontal direction and the intensity of the magnetization is relatively weaker at its middle portion and gradually becomes stronger towards both its side end portions.

14. A magnetron sputtering apparatus as claimed in claim 8 or 9, wherein the gradient adjusting means comprises a permanent magnet magnetized in a substantially horizontal direction and the height of the magnet is lower at its middle portion and gradually becomes higher towards both its side end portions.

15. A magnetron sputtering apparatus as claimed in claim 8 or 9, wherein the gradient adjusting means comprises a soft magnetic material of a size corresponding to about 20% to 90% of the distance between the inner and outer magnetic poles.

16. A magnetron sputtering apparatus as claimed in 15, wherein the gradient adjusting means accounts for from 60% to 80% of said distance.

* * * * *